US008834629B2

(12) United States Patent
Kolis et al.

(10) Patent No.: US 8,834,629 B2
(45) Date of Patent: Sep. 16, 2014

(54) RHOMBOHEDRAL FLUOROBERYLLIUM BORATE CRYSTALS AND HYDROTHERMAL GROWTH THEREOF FOR USE IN LASER AND NON-LINEAR OPTICAL APPLICATIONS AND DEVICES

(75) Inventors: Joseph W Kolis, Central, SC (US); Colin D. McMillen, Clemson, SC (US)

(73) Assignee: Clemson University, Clemson, SC (US)

( * ) Notice: Subject to any disclaimer, the term of this patent is extended or adjusted under 35 U.S.C. 154(b) by 1042 days.

(21) Appl. No.: 12/660,540

(22) Filed: Mar. 1, 2010

(65) Prior Publication Data

US 2010/0189619 A1    Jul. 29, 2010

Related U.S. Application Data

(62) Division of application No. 11/633,263, filed on Dec. 4, 2006, now Pat. No. 7,731,795.

(60) Provisional application No. 60/741,594, filed on Dec. 2, 2005.

(51) Int. Cl.
  *C30B 29/16*   (2006.01)
  *C30B 29/12*   (2006.01)
  *C30B 29/22*   (2006.01)
  *C30B 7/10*    (2006.01)

(52) U.S. Cl.
  CPC ............... *C30B 29/12* (2013.01); *C30B 29/22* (2013.01); *C30B 7/10* (2013.01)
  USPC ................... 117/72; 117/68; 117/70; 117/74; 117/944

(58) Field of Classification Search
  USPC ................................ 117/68, 70, 72, 74, 944
  See application file for complete search history.

(56) References Cited

FOREIGN PATENT DOCUMENTS

WO    2004/007352   *   1/2004

OTHER PUBLICATIONS

Batsanova, L.R. and Madaras, A.I., Neorganicheskie Materialy, 1972, 8, 779-780.
Baydina, I.A., et al., Zhurnal Strukturnoi Khimii, 1975, 16, 1050-1053.
Chen, C., et al., Appl. Phys. B, 2005, 80, 1-25.
Sasaki, T., et al., Mat. Sci. Eng. 2000, 30, 1-54.
Becker, P., Adv. Mater. 1998, 10, 979-992.
Chen, C., et al., J. Appl. Phys. 1995, 77, 2268-2272.
Keszler, D.A., Curr. Opin. Sol. State Mater. Sci. 1996, 1, 204-208.
Chen, C., Opt. Mater. 2004, 26, 425-429.
Chen, Feb. 2004, 91-93, 95.
Baydina et al., "The x-ray diffraction study of boratofluoroberyllates of the composition $MBe_2(F_2(M=Na, K, Rb, Cs)$", Zhurnal Strukturnoi Khimii (J. Struc. Chem.) 1975; 16(6):1050-53 with English Translation.
Mason, "Optical Properties and the Electro-optic and Photoelastic Effects in Crystals Expressed in Tensor Form", Bell System Technical Journal 1950; 29(2)161-188.
Chen et al., "Deep UV nonlinear optical crystal: $RbBe_2(BO_3)F_2$", J. Opt. Soc. Am. B 2009, 26(8):1519-25.
Solov'eva et al., "Crystal Structure of Potassium Boratofluoroberyllate, $KB_2(BO_3)F_2$", Soviet Physics—Crystallography 1971, 15(5):802-805.
Wood, EA, *Crystals in Light: An introduction to Optical Crystallography*, 2$^{nd}$ Ed, Dover Publication 1977; Chapter 5, pp. 53-61; Chapter 7, pp. 69-78; Chapter 12, pp. 112-123: Chapter 13, pp. 123-132.

* cited by examiner

*Primary Examiner* — Bob M Kunemund
(74) *Attorney, Agent, or Firm* — Dority & Manning, P.A.

(57) ABSTRACT

Single, acentric, rhombohedral, fluoroberyllium borate crystals of a size sufficient for use in a variety of laser and non-optical applications are formed by a hydrothermal method.

21 Claims, 3 Drawing Sheets

Fig. 3 ent application is a divisional of U.S. Ser. No. 11/633,263, filed Dec. 4, 2006 now U.S. Pat. No. 7,731,795, which claims priority from provisional application, U.S. Ser. No. 60/741,594, filed Dec. 2, 2005.

RHOMBOHEDRAL FLUOROBERYLLIUM BORATE CRYSTALS AND HYDROTHERMAL GROWTH THEREOF FOR USE IN LASER AND NON-LINEAR OPTICAL APPLICATIONS AND DEVICES

The present application is a divisional of U.S. Ser. No. 11/633,263, filed Dec. 4, 2006 now U.S. Pat. No. 7,731,795, which claims priority from provisional application, U.S. Ser. No. 60/741,594, filed Dec. 2, 2005.

FIELD OF THE INVENTION

The present invention is directed to fluoroberyllium borate crystals having the formula $MBe_2BO_3F_2$ (MBBF) wherein M is Rb, Cs, or Tl, made by a hydrothermal method for a wide variety of end-use applications. Alternate structures are formed by partially substituting the monovalent metal ion. Specifically, when made by the present hydrothermal method, single crystals of a size sufficient for use in a variety of optical applications are readily formed.

BACKGROUND OF THE INVENTION

It is well known that there is a steadily increasing demand for higher performance materials in optical applications. In many cases, these materials must be high quality single crystals of a size sufficiently large so that they are capable of being cut, shaped and polished into pieces several millimeters on a side. This is particularly true for solid state optical devices such as all solid state lasers and optical switching devices. For example, there has recently been a rapidly expanding application of new crystals finding use in diode pumped solid state lasers.

More specifically, there is a rapidly increasing demand for lasers capable of generating coherent radiation in the violet and ultraviolet region of the optical spectrum. In general these shorter wavelengths of coherent radiation have many useful properties. Shorter wavelength leads to greater resolution in applications such as lithography, micromachining, patterning labeling, information storage and related applications. In addition a convenient source of UV radiation would lead to significant advances in spectroscopy, biological applications and sensor technology. At present there are very few methods available for the generation of coherent laser radiation at wavelengths between 150 and 350 nm. The most common techniques rely on excimer lasers based on gases like krypton fluoride or fluorine, capable of generating 193 nm and 157 nm laser radiation respectively. However, these lasers require the use of corrosive gases. As such they are large, bulky, unreliable and restricted to a few specific wavelengths. Diode lasers that emit in the UV are the subject of intense research and, although showing some promise, are plagued by short lifetimes, low power and generally limited performance.

An attractive and simple alternative for UV lasers is the generation of short wavelength laser radiation by multiple harmonic generation of readily available longer wavelength laser sources using non-linear optical frequency multiplying crystals. Such an approach is typified in the visible region by the generation of 532 nm coherent radiation by the second harmonic generation of 1064 nm emission generated by conventional Nd:YAG, Nd:YVO$_4$ or related sources. In the case of 532 nm radiation, the non-linear optical crystal used for the frequency doubling is most typically $K(TiO)(PO_4)$ (KTP). The process generally can be used to generate relatively high powers, and employs solid crystals making the devices very reliable, compact and long lasting.

Frequency doubling is a non-linear optical process that combines two photons of one wavelength to produce a new photon of one half the wavelength. Thus, it is energy neutral. The process is not notably efficient but requires only passive optical components. The checklist of requirements for a successful second harmonic generation crystal is well understood. The crystal must grow in a space group having no center of symmetry and be a member of an acentric point group in a uniaxial or biaxial lattice type (rhombohedral, hexagonal, tetragonal, trigonal, orthorhombic or monoclinic) with a satisfactory non-linear optical (NLO) coefficient. In addition, the crystal must have moderate birefringence for phase matching, and must be transparent and optically stable to both the excitation and generated wavelengths. The crystal must have good physical properties, be thermally stable, hard enough to fabricate and polish and be mechanically stable and non-hygroscopic.

Most importantly, the crystal must be able to be produced in high quality in a suitable size (typically several millimeters per side or larger) for optoelectronic applications. For generation of light in the visible region and the near IR, several excellent crystals exist that fulfill these requirements, including KTP, KTA, LiNbO$_3$ and KNbO$_3$. However, none of these are suitable for generation of near UV, UV or deep UV radiation as their band gaps are not large enough, so they absorb all of the resultant second harmonic radiation. In the past two decades, several new crystals have been introduced to fulfill the minimum requirements described above. They are typically borates with band gaps sufficiently large to allow for the generation of limited UV wavelengths. Borates are especially attractive because they often have band gaps that are sufficiently wide to accommodate UV radiation and tend to crystallize in acentric space groups. The most common of these is β-BaB$_2$O$_4$ (BBO) that is typically used for the generation of 266 nm radiation through the frequency doubling of 532 nm radiation. Several other crystals with unique structures have also been introduced recently including LiB$_3$O$_5$ (LBO) and CsLiB$_6$O$_{10}$ (CLBO). All these materials have some commercial availability.

Although these materials do crystallize in acentric space groups and have sufficiently wide absorption band gaps to allow formation of radiation in part of the UV spectrum, they all have considerable limitations. For example BBO has an insufficiently wide band gap to allow generation of radiation with wavelengths shorter than 220 nm. In particular the presence of a B$_3$O$_6$ ring in the crystal lattice leads to the presence of a band gap that is not large enough for frequency mixing below 200 nm. The other crystals currently used for non-linear optical applications in the UV are LBO and CLBO. Both of these also have severe limitations. In particular, LBO has an extremely low NLO coefficient and does not phase-match well, while CLBO is very hygroscopic. There are numerous other crystals, typically borates that have been reported as growing in acentric space groups and having suitable wide band gaps for UV radiation. However, they almost all have insufficient birefringence to allow for phase matching. The inability to phase-match is an important limitation that renders these otherwise promising crystals useless for any practical NLO related applications. Thus there is considerable demand for new crystals that can meet the criteria for second harmonic generation over a reasonably wide range of the UV spectrum.

In the last decade two new berylloborates with the formulas KBe$_2$BO$_3$F$_2$ (KBBF) and Sr$_2$Be$_2$B$_2$O$_7$ (SBBO), were reported that seem to fulfill most of the necessary requirements. They have band gaps near 155 nm and grow in appropriate acentric space groups. Most importantly they seem to have moderate birefringence and appear capable of phase matching over a fairly wide range below 220 nm. Thus they seem like very promising candidates for generation of a wide range of UV and deep UV laser radiation using well-understood solid-state technology. Preliminary reports suggest that both materials KBBF and SBBO have properties that make them suitable for numerous applications requiring non-linear optical behavior.

However, there is a serious limitation to the practical introduction of the berylloborates KBBF and SBBO in any of the above applications. All of the applications described herein require high quality single crystals of a certain size, typically 3-5 millimeters after cutting and polishing. Thus, any useful application requires raw product in the form of single crystals at least one centimeter per edge. For commercial production, the size must be at least several centimeters per edge. These same formulas in the form of microcrystals, powders or small, low quality crystals are essentially worthless for optoelectronic applications. Only large, high quality crystals provide material with any technical use. This is particularly true for solid state optical devices such as all solid state lasers and optical switching devices.

The growth of both crystals KBBF and SBBO is extremely problematic. Although both materials were reported to grow out of molten fluxes, the growth method has not proven to be reproducible or suitable for crystals of sufficient quality for any optical application. This dramatic shortcoming has prevented the introduction of these promising materials into any prototype device and has even limited the further measurement of the physical properties of the materials. Despite repeated attempts by the original authors they report that they have been unable to produce satisfactory single crystals using any flux technology. The products are always too small, cracked, flaky and generally poor quality for any conceivable optical application. In addition, KBBF is negatively affected by the fact that the material has a strong natural tendency to form crystals with an extremely layered or "micaceous" habit. They form crystals with layers that are easily peeled and highly disordered like mica. This habit is debilitating to the use of the material in optoelectronic applications because the material cannot be cut and processed adequately nor grown as single crystals of suitably high quality.

Early literature provides a brief mention of powders with the nominal formulas $RbBe_2BO_3F_2$ and $CsBe_2BO_3F_2$, but no mention is made of crystals of this formulation, nor of any applications. Furthermore, no structural information is provided of these above formulations other than to presume that their structure is based on a monoclinic structure similar to that of a powder with the formula $NaBe_2BO_3F_2$.

Hydrothermal techniques are an excellent route to high quality single crystals for electro-optic applications. For example, all electronic grade quartz is grown commercially by the hydrothermal method. Further, KTP is grown by both flux and hydrothermal methods, and it is widely acknowledged by those skilled in the art that the hydrothermally grown product is of generally superior quality. The hydrothermal method involves the use of superheated water (liquid water heated above its boiling point) under pressure to cause transport of soluble species from a nutrient rich zone to a supersaturated growth zone. Generally a seed crystal is placed in the growth zone. The growth and supersaturation control is achieved by the use of differential temperature gradients. The superheated fluid is generally contained under pressure, typically 5-30 kpsi, in a metal autoclave. Depending on the chemical demands of the system the autoclave can be lined with a nobel metal using a either fixed or floating liner. These general techniques are well known in the art and have been used for the growth of a variety of other electro-optic crystals.

SUMMARY OF THE INVENTION

Accordingly, the present invention is directed to a new series of berylloborates $RbBe_2BO_3F_2$ (RBBF), $CsBe_2BO_3F_2$ (CBBF) and $TlBe_2BO_3F_2$ (TBBF) and numerous derivatives where the alkali metal Cs, Rb or Tl is partially substituted by each other or other monovalent metal ions like K, Na, Li, Cu or other monovalent ions. Also disclosed is a new commercially viable route to large single crystals of these compounds using a hydrothermal crystal growth process. The crystals are of sufficient size and quality to be cut, polished and coated for optical applications. The crystals form in the same space group (R32) as the known, related structure, KBBF. The crystals have uniaxial acentric structures with wide band gaps (<200 nm). This represents a significant advancement in the field, as the resultant products can be employed directly in a number of solid-state optoelectronic devices such as lasers emitting coherent radiation below 220 nm wavelengths. The technique is a low temperature method compared to existing melt growth methods, with crystals being grown at temperatures generally below 650° C. The invention disclosed herein allows for production of crystals grown in sufficiently large size as to be able to be cut and oriented so as to be useful for optical and optoelectronic applications. This size is typically in excess of 3-5 mm on any edge. Using the hydrothermal invention disclosed herein, crystals of RBBF, CBBF, TBBF and MM'BBF (M=Rb, Cs or Tl, M' is a metallic monovalent ion such as $Cs^+$, $Rb^+$, $K^+$, $Na^+$, $Li^+$, $Cu^+$ or $Tl^+$, and M and M' differ) of exceptionally high quality can be prepared in sizes exceeding several centimeters per edge. This is more than adequate for the crystals to be cut, polished and oriented for any NLO application.

Thus, the present invention is directed to a method for making rhombohedral fluoroberyllium borate crystals having the formula $MBe_2BO_3F_2$ (MBBF) wherein M is Rb, Cs, or Tl, which includes the steps of providing microcrystalline $MBe_2BO_3F_2$ powder, wherein M is Rb, Cs, Tl, and recrystallizing the microcrystalline $MBe_2BO_3F_2$ in an aqueous solution at a temperature of from about 300° C. to about 600° C. and at a pressure of from about 4 kpsi to about 30 kpsi, the aqueous solution including fluoride ions at a concentration of from about $1 \times 10^{-6}$ to about 5 molarity. In one embodiment the step of providing microcrystalline $MBe_2BO_3F_2$ powder, wherein M is Rb, Cs, or Tl, involves reacting $MBF_4$, BeO, and a borate such as $B_2O_3$ and $H_3BO_3$ in an air atmosphere at a temperature of at least about 700° C. for at least about 1 hour. Preferably, the step of recrystallizing the microcrystalline $MBe_2BO_3F_2$ occurs in an aqueous solution containing fluoride ions at a concentration of from about 0.1 to about 1 molarity, at a temperature of from about 400° C. to about 550° C., and at a pressure of from about 12 kpsi to about 18 kpsi. The present invention is also directed to the novel rhombohedral fluoroberyllium borate crystal made by this method.

Further, the present invention is directed to a method for making rhombohedral fluoroberyllium borate crystals having the formula $MBe_2BO_3F_2$ (MBBF) wherein M is Rb, Cs, or Tl, which includes the steps of reacting $MBF_4$, BeO, and a borate such as $B_2O_3$ and $H_3BO_3$ in an aqueous solution at a temperature of from about 300° C. to about 600° C. and at a pressure of from about 8 kpsi to about 40 kpsi, the aqueous solution further containing fluoride ions at a concentration of from about 0.01 to about 5 molarity. Preferably, the fluoride ions are present in the aqueous solution at a concentration of from about 0.25 to about 1 molarity, the temperature ranges from about 450° C. to about 550° C., and the pressure ranges from about 12 kpsi to about 18 kpsi. The present invention is also directed to the novel fluoroberyllium borate crystal made by this method.

Additionally, the present invention is directed to a method for making rhombohedral fluoroberyllium borate crystals having the formula $MBe_2BO_3F_2$ (MBBF) wherein M is Rb, Cs, or Tl, which includes the steps of providing a pressure vessel having a growth region and a nutrient region, providing a seed crystal having the formula $MBe_2BO_3F_2$, positioning the seed crystal in the growth region of the pressure vessel, providing a medium having a nutrient and a mineralizer in the nutrient region, wherein the nutrient is powdered or microcrystalline $MBe_2BO_3F_2$, and the mineralizer is fluoride ions, and heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 300° C. to about 500° C., the nutrient temperature ranging from about 450° C. to about 600° C., the nutrient temperature being higher than the growth temperature and the pressure ranging from about 8 kpsi to about 40 kpsi. Preferably, the fluoride ions are present in the medium at a concentration of from about 0.01 to about 5 molarity, the growth temperature ranges from about 375° C. to about 425 C, the nutrient temperature ranges from about 475° C. to about 525° C., and the pressure ranges from about 12 kpsi to about 18 kpsi. The present invention is also directed to the crystal made by this method.

Additionally, the present invention is directed to a single acentric, rhombohedral, fluoroberyllium borate crystal having the formula $MBe_2BO_3F_2$, wherein M is Rb, Cs, or Tl, belonging to the R32 space group and 32 point group. The present inventive crystal has a dimension of at least 2 mm in one direction and exhibits non-linear optical properties.

Furthermore, the present invention is directed to a single acentric, rhombohedral, fluoroberyllium borate crystal having the formula $M_{(1-x)}M'_xBe2BO_3F_2$, wherein M and M' are differing monovalent metal ions, wherein M is selected from the group consisting of $Rb^+$, $Cs^+$, or $Tl^+$, and wherein M' is selected from the group consisting of $K^+$, $Na^+$, $Rb^+$, $Cs^+$, $Li^+$, $Cu^+$ and $Tl^+$, belonging to the R32 space group and 32 point group.

In one embodiment such crystal is formed by a process including the steps of providing a microcrystalline powder of $M_{(1-x)}M'_xBe_2BO_3F_2$, wherein M and M' are differing monovalent metal ions, wherein M is selected from the group consisting of $Rb^+$, $Cs^+$, or $Tl^+$, and wherein M' is selected from the group consisting of $K^+$, $Na^+$, $Rb^+$, $Cs^+$, $Li^+$, $Cu^+$ and $Tl^+$, and recrystallizing the microcrystalline powder in an aqueous solution at a temperature of from about 300° C. to about 600° C. and at a pressure of from about 8 kpsi to about 40 kpsi, the aqueous solution comprising fluoride ions at a concentration of from about $1\times10^{-6}$ to about 5 molarity. Optionally, the step of providing a microcrystalline powder of $M_{(1-x)}M'_xBe_2BO_3F_2$, wherein M and M' are differing monovalent metal ions, wherein M is selected from the group consisting of $Rb^+$, $Cs^+$, or $Tl^+$, and wherein M' is selected from the group consisting of $K^+$, $Na^+$, $Rb^+$, $Cs^+$, $Li^+$, $Cu^+$ and $Tl^+$, involves reacting $MBF_4$, $M'BF_4$, BeO and a borate compound selected from $H_3BO_3$ and $B_2O_3$ in an air atmosphere at a temperature of at least about 700° F. for at least about 1 hour. Preferably, the step of recrystallizing the microcrystalline $M_{(1-x)}M'_xBe_2BO_3F_2$ occurs in an aqueous solution containing fluoride ions at a concentration of from about 0.25 to about 1 molarity, at a temperature of from about 375° C. to about 425° C., and at a pressure of from about 12 kpsi to about 18 kpsi.

Alternatively, such crystal is formed by a process which includes the steps of reacting $MBF_4$, $M'BF_4$, BeO, and a borate such as $B_2O_3$ or $H_3BO_3$ in an aqueous solution at a temperature of from about 300° C. to about 600° C. and at a pressure of from about 8 kpsi to about 40 kpsi, the aqueous solution further containing fluoride ions at a concentration of from about 0.01 to about 5 molarity. Preferably, the fluoride ions are present in the aqueous solution at a concentration of from about 0.25 to about 1 molarity, the temperature ranges from about 400° C. to about 500° C., and the pressure ranges from about 12 kpsi to about 18 kpsi.

It is also within the scope of the present invention that such crystal is made by a process including the steps of providing a pressure vessel having a growth region and a nutrient region, providing a seed crystal having the formula $M_{(1-x)}M'_xBe_2BO_3F_2$, wherein M and M' are differing monovalent metal ions, wherein M is selected from the group consisting of $Rb^+$, $Cs^+$, or $Tl^+$, and wherein M' is selected from the group consisting of $K^+$, $Na^+$, $Rb^+$, $Cs^+$, $Li^+$, $Cu^+$ and $Tl^+$, positioning the seed crystal in the growth region of the pressure vessel, providing a medium including a nutrient and a mineralizer in the nutrient region, wherein the nutrient is powdered or microcrystalline $M_{(1-x)}M'_xBe_2BO_3F_2$ and wherein the mineralizer is fluoride ions, and heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 300° C. to about 500° C., the nutrient temperature ranging from about 450° C. to about 600° C., the nutrient temperature being higher than the growth temperature and the pressure ranging from about 8 kpsi to about 40 kpsi. Preferably, the fluoride ions are present in the medium at a concentration of from about 0.01 to about 5 molarity, the growth temperature ranges from about 375° C. to about 425° C., the nutrient temperature ranges from about 475° C. to about 525° C., and the pressure ranges from about 12 kpsi to about 18 kpsi.

BRIEF DESCRIPTION OF THE FIGURES OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

DETAILED DESCRIPTION OF THE PREFERRED EMBODIMENTS

The present invention is directed to a process to grow single crystals of $MBe_2BO_3F_2$ (MBBF) wherein M is Rb, Cs, or Tl, which are of sufficient size to be cut into crystals for use in solid state lasers and optical switches (generally, equal or greater than 2 mm per side). This method involves growth at temperatures between 350 and 600° C. and pressures between 6000 and 30,000 psi. The process is unique in that it provides a useful, technologically applicable method to grow crystals of sufficient size for use in laser and optoelectronic devices. Specifically, large single crystals are grown in hydrothermal solutions above 300° C. and the materials have a positive solubility coefficient allowing transport from a hotter feedstock zone to a relatively cooler growth zone.

Further, the present invention is directed to a novel method to grow single crystals of new berylloborates RBBF, CBBF, and TBBF of a size and quality useful for a variety of laser and electro-optic applications. The invention is specific to crystals of the formula $RbBe_2BO_3F_2$ (RBBF), $CsBe_2BO_3F_2$ (CBBF), and $TlBe_2BO_3F_2$ (TBBF), and related materials MBBF where M is $Rb^+$, $Cs^+$ or $Tl^+$ and can be substituted in numerous ratios by other metal ions with a formal +1 charge such as $Rb^+$, $Cs^+$, $Tl^+$, $Li^+$, $Na^+$, $Cu^+$ or $K^+$ in any combination. These formulations as single crystals in the uniaxial rhombohedral structure type are novel products. The invention also represents a novel process whereby the products can be prepared as single crystals of sufficient size and quality to be used in optical applications. These applications particularly focus on ultraviolet and deep ultraviolet applications, namely those involving wavelengths below 288 nm. These applications include but are not limited to frequency multiplying, optical parametric oscillation, waveguides and other non-linear optical applications.

The hydrothermal method involves water heated under pressure to temperatures substantially higher than its boiling point. Typically, optimum crystal growth conditions require a positive solubility coefficient of the desired crystal, an appropriate mineralizer and temperatures between 300 and 600° C. It allows growth of single crystals of a size sufficient to cut polished, coated and aligned for used in applications (at least 2 millimeters on an edge for finished product). For these compounds, the mineralizer can also be some source of fluoride ion such as KF, RbF, CsF or related fluorides. Alternatively, the mineralizer can be other salts that act as a source of small soluble ions with a negative charge such as $OH^-$, $Cl^-$, $CO_3^{2-}$, $HCO_3^-$, $H_2BO_3^-$, $NO_3^-$ and other similar ions. RBBF, CBBF, TBBF and the various combinations MM'BBF in accordance with the present invention can also be transported and grown using pure water or mild or weak acids such as dilute HCl, HBr, $HNO_3$, $H_3BO_3$ and other mild acids.

The present inventive process can lead to production of large crystals of a size that is only limited by the size of the growth chamber and the time of growth. Thus, crystals as large as 10 centimeters on an edge can be grown. In addition, the quality of the crystals is very high and can be cut, polished and aligned to perform a wide variety of optoelectronic functions requiring acentric, birefringent crystals with an optical transparency near 150 nm, of a desired size. The process is novel in that it employs a new type of route to single crystals of materials that can be used in short wavelength NLO applications.

In accordance with the present invention, the present novel crystal may be formed by one of three possible hydrothermal methods. By the first method a microcrystalline powder of the desired composition is recrystallized under hydrothermal conditions. Thus, the recrystallization occurs in an aqueous solution at a temperature of from about 300° C. to about 600° C., at a pressure of from about 4 kpsi to about 30 kpsi, and at a fluoride concentration of from about $1 \times 10^{-6}$ to about 5 molarity. Preferred conditions are a temperature of from about 400° C. to about 550° C., a fluoride concentration of from about 0.1 to about 1 molar, and a pressure of from about 12 to 18 kpsi. Although it may be obtained from other sources the microcrystalline powder may be made by reacting $MBF_4$ (where M is Rb, Cs, or Tl), BeO, and a borate such as $B_2O_3$ or $H_3BO_3$ in an air atmosphere at a temperature of at least about 700° C. for at least about 1 hour. This first method may also be employed for making a crystal of the formula $M_{(1-x)}M'_xBe2BO_3F_2$, wherein M and M' are differing monovalent metal ions, wherein M is selected from the group consisting of $Rb^+$, $Cs^+$, or $Tl^+$, and wherein M' is selected from the group consisting of $K^+$, $Na^+$, $Rb^+$, $Cs^+$, $Li^+$, $Cu^+$ and $Tl^+$. Hereagain, although it may be obtained from other sources the microcrystalline powder may be made by reacting $MBF_4$, $M'BF_4$, BeO, and a borate such as $B_2O_3$ or $H_3BO_3$ in an air atmosphere at a temperature of at least about 700° C. for at least about 1 hour.

By the less preferred method of spontaneous nucleation the crystal may be formed and grown from the reactants in one step. Thus, $MBF_4$, BeO, and a borate such as $B_2O_3$ or $H_3BO_3$ (or $MBF_4$ (where M is Rb, Cs, or Tl), $M'BF_4$ (where M' differs from M and is K, Na, Rb, Cs, Li, Cu, or Tl), BeO, and a borate such as $B_2O_3$ or $H_3BO_3$) are reacted in an aqueous solution at a temperature of from about 300° C. to about 600° C. and at a pressure of from about 8 kpsi to about 40 kpsi, the aqueous solution further containing fluoride ions at a concentration of from about 0.01 to about 5 molarity. Preferred conditions are a temperature of from about 450° C. to about 550° C., a fluoride concentration of from about 0.25 to about 1 molar, and a pressure of from about 12 to 18 kpsi. The crystals formed by spontaneous nucleation are generally between 0.5 and 5 millimeters on and edge and are often polynuclear and of insufficient quality for device application. However, these crystals can often be used as seeds for transport growth.

Figure 1:
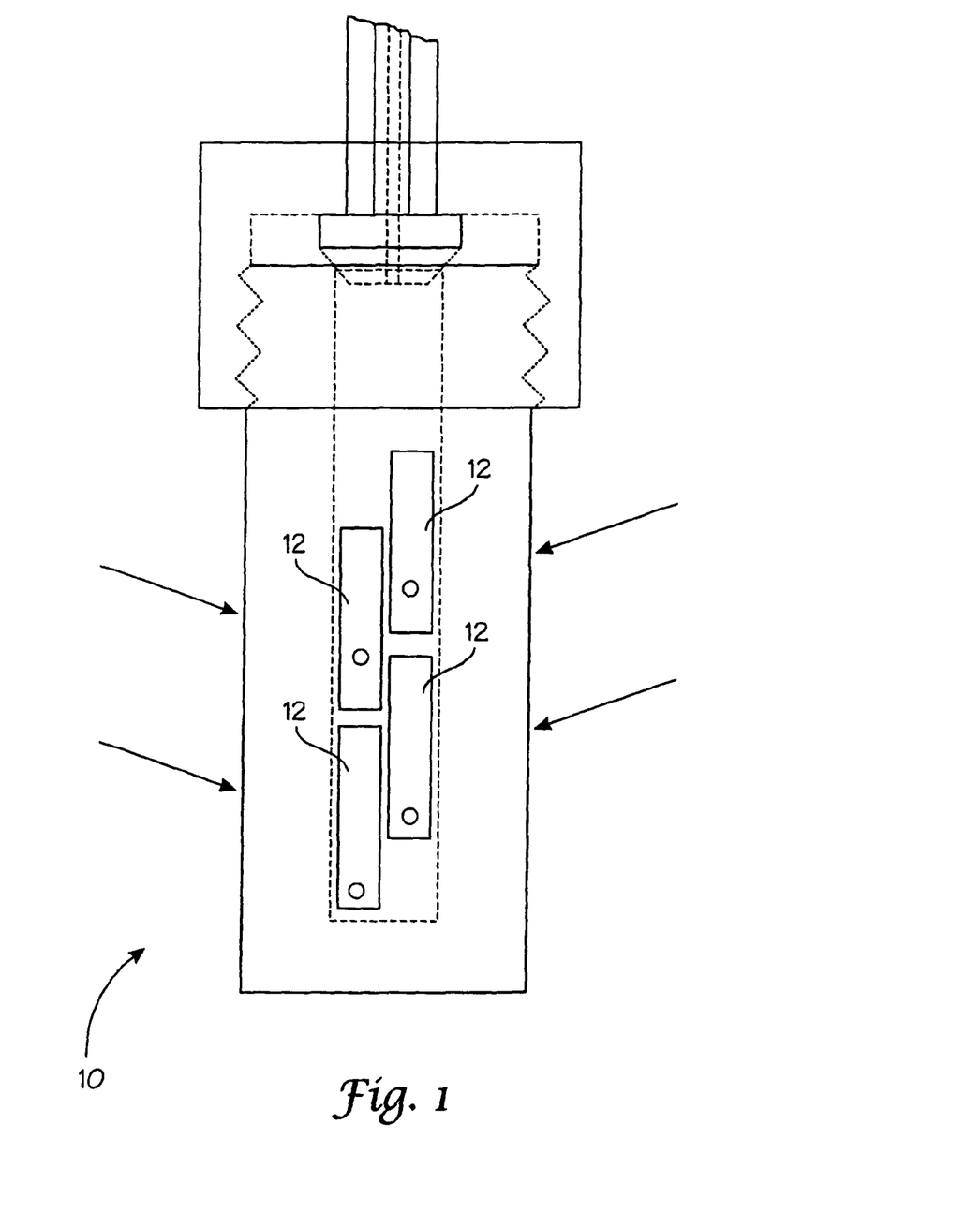
FIG. 1 schematically illustrates an autoclave loaded for crystal growth under hydrothermal conditions.

FIG. 1 schematically represents a preferred autoclave 10 employed in achieving the temperature and pressure conditions necessary for the present reaction. The reactants are added to a silver tube 12 which preferably may have a diameter of 0.25 in and a length of 2 in. Then, the mineralizer source is added to the tube and it is welded shut. The sealed tube or ampoule is placed in the autoclave which, in one preferred embodiment, has an internal diameter of ½ in and a depth of 6 in. Water is added to the autoclave, filling approximately 75% of the remaining free volume of the autoclave. The autoclave is sealed shut using a cold seal. The sealed autoclave containing the sealed silver ampoule is placed in a tube furnace oriented in a vertical position. The furnace is heated to the desired elevated temperature and held at that temperature for an extended period of time. The water in the autoclave expands at this elevated temperature to create the desired elevated pressure. Thereafter, the autoclave is removed from the oven and cooled in a stream of air.

More preferred is the transport growth method whereby seed crystals are positioned in a growth region of a pressure vessel, and a medium which contains a nutrient and a mineralizer are provided in a nutrient region of the vessel. For the present invention the seed crystals are of the desired MBBF or MM'BBF composition, the nutrient is powdered or microcrystalline MBBF or MM'BBF, and the mineralizer is, preferably, fluoride ions. The vessel is heated and pressurized such that a growth temperature is produced in the growth region, a nutrient temperature is produced in the nutrient region, and a temperature gradient is produced between the growth region and the nutrient region such that growth of the crystal is initiated. The growth temperature ranges from about 300° C. to about 450° C., the nutrient temperature ranges from about 450° C. to about 600° C., with the nutrient temperature always being higher than the growth temperature. The pressure ranges from about 8 kpsi to about 40 kpsi. The fluoride ion concentration preferably ranges from about 0.01 to about 5 molarity. Preferred conditions are a growth temperature of from about 375° C. to about 425 C, a nutrient temperature ranges from about 475° C. to about 525° C., and a pressure of from about 12 kpsi to about 18 kpsi. By the present transport growth method the thermal gradient induces transport because 1) it causes supersaturation at the seed in the "cool" zone leading to precipitation and 2) the thermal gradients induce the formation of convection currents leading to mass transfer from the feedstock to growth zone. Thus, the small seed crystals ripen and increase in size eventually become sufficiently large to be useful in optical applications.

Figure 2:
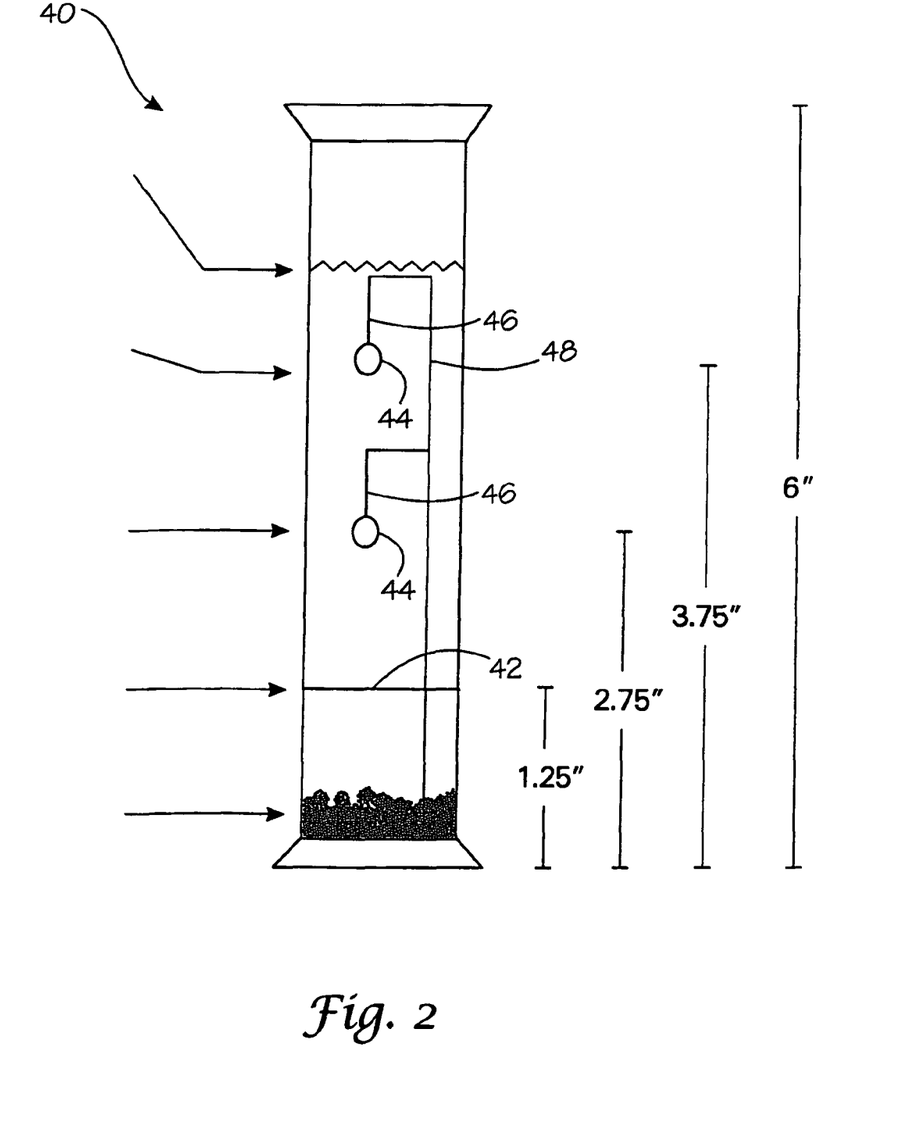
FIG. 2 schematically illustrates a representative silver tube with seed crystals suspended from a ladder for the growth of larger crystals in accordance with one method of the present invention, specifically a transport growth technique.

Specifically, the apparatus for performing the hydrothermal growth transport method is shown in FIG. 2 which shows silver tube 20, preferably of dimensions ⅜ in by 6 in. Specific dimensions are shown in FIG. 2 in order to clarify relative dimensions. It is to be understood that tubes of varying sizes may be and are employed. A silver baffle 22 with three small holes in it is placed 1.25 in above the bottom of the tube. Two single crystals 24 of MBBF prepared in accordance with the present invention, each approximately 2×2×4 mm, serve as seeds. Holes are drilled in the crystals and they are hung by silver thread 26 on a small silver ladder 28 placed within the tube. The two seed crystals are hung 2.75 in and 3.75 in above the bottom of the tube, respectively. Preferably, the aqueous fluoride solution is added to the tube and fills about 80% of the remaining volume of the tube. The tube is welded shut and placed in an autoclave with a cold seal and a ½ in by 8 in opening. An amount of water sufficient to occupy 80% of the remaining free volume is added and the autoclave sealed and placed in an upright tube furnace. The autoclave is heated with a temperature gradient. After an extended period of time, the autoclave is cooled, opened and the silver tube opened.

Growths are typically performed in autoclaves capable of containing the high temperatures and pressures, usually constructed of a nickel-based alloy such as Inconel or Rene 41. The containers typically contain nobel metal liners of either the floating or fixed variety.

Figure 3:
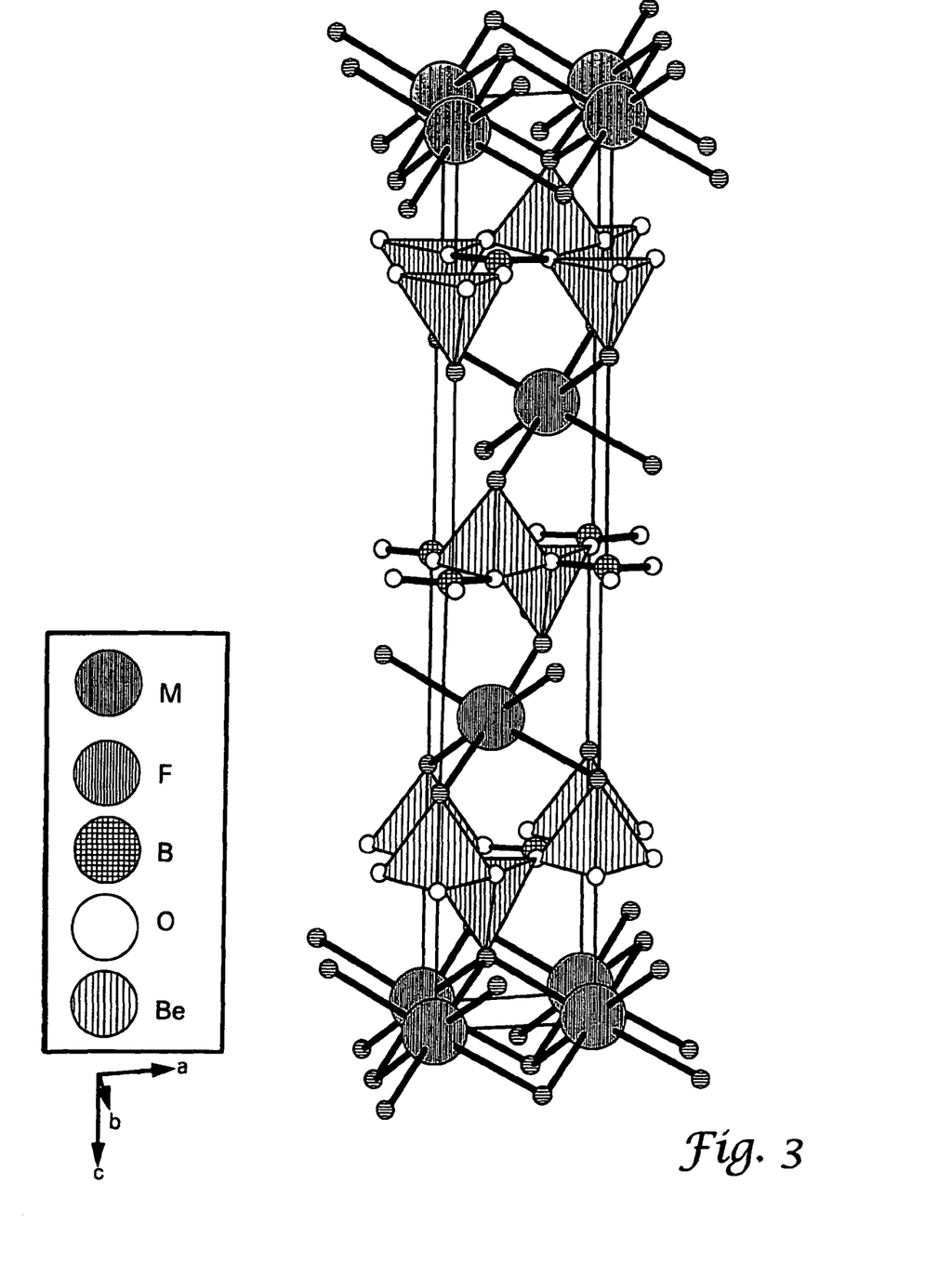
FIG. 3 illustrates a representative crystal structure in accordance with the present invention.

As is shown in FIG. 3, crystals in accordance with the present invention have layered $BO_3$ groups with the terminal oxygen atoms linked to beryllium atoms. The beryllium atoms are tetrahedrally coordinated to three oxygen atoms and one fluoride. It is the planar borates that interact with incoming photons in optical devices that provide the non-linear optical coefficients that make the present crystals useful in optoelectronic applications. The trigonal planar borates and tetrahedral beryllates form connected groups that create an alternating layered structure. The alkali metal, M, is located between the layers linked to the various fluorides.

Crystallographic data for representative inventive crystal structures is set forth in Table I, below.

Further illustrations of the invention are provided in the Examples, below.

Example 1

RBBF single crystals were synthesized by the hydrothermal recrystallization of a powdered RBBF starting material. The starting material was synthesized according to the solid-state reaction:

$$3RbBF_4 + 6BeO + B_2O_3 \rightarrow 3RbBe_2BO_3F_2 + 2BF_3$$

The above chemicals were carefully weighed, combined and ground to a homogeneous powder, which was placed in a platinum crucible and heated at 700° C. for one day under air. The resulting white powder was used as the starting material for hydrothermal recrystallization.

RBBF powder from the above reaction was placed in a silver ampoule whose bottom has been welded shut (for ¼" ampoules, 0.1 g RBBF and 0.4 mL of 1M RbF mineralizer are used; for ⅜" ampoules, 1 g RBBF and 4 mL mineralizer are used). After the mineralizer solution was added to the ampoule, the top of the ampoule was crimped and welded shut. Deionized water or rubidium fluoride mineralizers below 4M concentrations are preferred for RBBF synthesis. The use of other alkali metal fluorides as mineralizers leads to substitution at the alkali metal site, and higher concentrations of RbF lead to the formation of $Rb_2BeF_4$ as an impurity phase. The filled and sealed ampoules were placed in an autoclave and counter-pressured with water to prevent the ampoules from bursting. The autoclave was sealed and heated (either in a vertical furnace or by ceramic band heaters) to 575° C. (generating a pressure between 15 and 30 kpsi), and held at this temperature for five days. After this period, it was allowed to cool to room temperature over 18 hours. The yield of this reaction was 100% RBBF. The largest RBBF crystals grown by this method were approximately 7 mm in their greatest dimension.

Example 2

The hydrothermal recrystallization reaction of Example 1 was repeated with the starting material synthesized according to the solid-state reaction:

$$3CsBF_4 + 6BeO + B_2O_3 \rightarrow 3CsBe_2BO_3F_2 + 2BF_3$$

The mineralizer was CsF. The yield of this reaction was 100% CBBF.

TABLE I

| Formula | $K_{0.61}Rb_{0.39}Be_2BO_3F_2$ | $RbBe_2BO_3F_2$ | $Rb_{0.88}Cs_{0.12}Be_2BO_3F_2$ | $CsBe_2BO_3F_2$ |
|---|---|---|---|---|
| Formula Weight | 172.03 | 200.33 | 206.02 | 247.73 |
| Space Group | R32 | R32 | R32 | R32 |
| a | 4.4310(6) | 4.4395(6) | 4.4461(6) | 4.4575(4) |
| c | 19.266(4) | 19.825(4) | 20.132(4) | 21.310(4) |
| V | 327.59(9) | 338.39(9) | 344.65(9) | 366.68(10) |
| Z | 3 | 3 | 3 | 3 |
| Density | 2.615 | 2.949 | 2.977 | 3.366 |
| R | 0.0198 | 0.0531 | 0.0275 | 0.0156 |
| wR2 | 0.0510 | 0.1294 | 0.0613 | 0.0341 |
| Goodness of Fit | 1.122 | 1.205 | 1.151 | 1.247 |
| Flack Parameter | 0.02(3) | 0.03(7) | 0.01(5) | −0.09(7) |
| Ref. Col./Unique | 1058/160 | 1146/201 | 1092/164 | 1166/200 |
| R merge | 0.0594 | 0.1288 | 0.0895 | 0.0484 |
| Abs. Coeff. $(mm^{-1})$ | 4.852 | 10.918 | 13.325 | 7.523 |

Example 3

Rb$_{0.39}$K$_{0.61}$BBF crystals were formed using a pre-made microcrystalline feedstock using a hydrothermal method similar to that set forth in Example 1.

Rb$_{0.39}$K$_{0.61}$BBF starting powder was prepared by the solid state reaction:

$$1.83KBF_4 + 1.17RbBF_4 + 6BeO + 2H_3BO_3 \rightarrow 3Rb_{0.39}K_{0.61}BBF + 2BF_3 + 3H_2O$$

The reactants were ground together and placed in a platinum crucible, then heated at 700° C. for one day in an air atmosphere. The mixed-composition product was then used as a charge for hydrothermal crystallization.

The charge was loaded into the reaction ampoules and autoclaves as described in Example 1. For this example, a 1M fluoride stock solution was made by dissolving 0.061 moles of KF and 0.039 moles of RbF in 100 mL of deionized water. The desired amount of mineralizer for a given experiment of this particular composition can then be measured and used from this stock solution (again, 0.4 mL for ¼" ampoules and 4 mL for ⅜" ampoules). The autoclave containing the ampoules was heated to 575° C. (~25 kpsi counter-pressure) and held at that temperature for 3 or more days, after which it was cooled and the crystals were harvested. The crystals were then subjected to elemental analysis techniques and single crystal x-ray diffraction to confirm that the desired composition had been maintained.

Example 4

Alternatively, crystals of this mixed composition of Example 3 can also be obtained by using one of the end members as a starting charge and using a fluoride mineralizer to introduce a substituting ion. Here, KBBF was selected as the feedstock and made by the solid-state reaction:

$$3KBF_4 + 6BeO + B_2O_3 \rightarrow 3KBe_2BO_3F_2 + 2BF_3$$

This starting charge was reacted with 1M RbF in a sealed ampoule contained in an autoclave under the conditions described above. The mass of the charge (0.97 g KBBF) and volume and concentration of mineralizer used (4 mL 1M RbF) were carefully chosen to reflect the desired K:Rb ratio in Rb$_{0.39}$K$_{0.61}$BBF. The K:Rb ratios of the resulting crystals were quantified using common elemental analysis techniques, confirming that the desired degree of substitution had been achieved.

Example 5

RBBF crystals made in accordance with Example 1 were drilled and tied using platinum wire (0.1 mm diameter) onto a ladder fashioned from thicker wire (1 mm diameter) of the same precious metal. The crystals were hung 5-6 inches above the level of the feedstock, allowing the desired temperature gradient to be established over this distance.

Transport growth experiments can be performed in both floating and fixed liners. When using the floating liners, no baffle is included on the ladder apparatus because of the uncertainty already introduced by the ampoule's compression under the high counter-pressures. In fixed-liner systems, the baffle is affixed to the ladder approximately ½ inch above the level of the feedstock to regulate the flow of the super-saturated solution. The amount of feedstock and volume of mineralizer can be scaled according to the volume of the liner. Employing a ⅜" floating liner, the typical amounts of about 1 g of RBBF feedstock and 4 mL of mineralizer solution were employed. Using a 0.5M RbF mineralizer over a 45° C. thermal gradient (520° C. hot zone and a 475° C. growth zone) for six days, more than 180 mg of RBBF was transported to the seed to grow a very high quality single crystal. In conjunction with this mass increase, the dimensions of the seed can increase by several millimeters on each edge over this time frame.

Preferred embodiments of the invention have been described using specific terms and devices. The words and terms used are for illustrative purposes only. The words and terms are words and terms of description, rather than of limitation. It is to be understood that changes and variations may be made by those of ordinary skill art without departing from the spirit or scope of the invention, which is set forth in the following claims. In addition it should be understood that aspects of the various embodiments may be interchanged in whole or in part. Therefore, the spirit and scope of the appended claims should not be limited to descriptions and examples herein. Moreover, Applicants hereby disclose all sub-ranges of all ranges disclosed herein. These sub-ranges are also useful in carrying out the present invention.

We claim:

1. A rhombohedral fluoroberyllium borate crystal belonging to the R32 space group and 32 point group and having the formula MBe$_2$BO$_3$F$_2$(MBBF) wherein M is Rb, Cs, or Tl.

2. A single acentric, rhombohedral, fluoroberyllium borate crystal having the formula MBe$_2$BO$_3$F$_2$, wherein M is Rb, Cs, or Tl, belonging to the R32 space group and 32 point group.

3. The rhombohedral, fluoroberyllium borate crystal set forth in claim 2 having a dimension of at least 2 mm in one direction and exhibiting non-linear optical properties.

4. A single acentric, rhombohedral, fluoroberyllium borate crystal having the formula M$_{(1-x)}$M'$_x$Be$_2$BO$_3$F$_2$, wherein M and M' are differing monovalent metal ions, wherein M is selected from the group consisting of Rb$^+$, Cs$^+$, or Tl$^+$, and wherein M is selected from the group consisting of K$^+$, Na$^+$, Rb$^+$, Cs$^+$, Li$^+$, Cu$^+$, and Tl$^+$, belonging to the R32 space group and 32 point group.

5. The rhombohedral fluoroberyllium borate crystal set forth in claim 1, in which M is partially substituted by a monovalent metal ion.

6. The rhombohedral fluoroberyllium borate crystal set forth in claim 1, in which M is Rb.

7. The rhombohedral fluoroberyllium borate crystal set forth in claim 6, in which Rb is partially substituted by Cs or Tl.

8. The rhombohedral fluoroberyllium borate crystal set forth in claim 1, in which M is Cs.

9. The rhombohedral fluoroberyllium borate crystal set forth in claim 8, in which Cs is partially substituted by Rb or Tl.

10. The rhombohedral fluoroberyllium borate crystal set forth in claim 1, in which M is Tl.

11. The rhombohedral fluoroberyllium borate crystal set forth in claim 10, in which Tl is partially substituted by Cs or Rb.

12. The rhombohedral fluoroberyllium borate crystal set forth in claim 1, in which the crystal has a uniaxial acentric structure.

13. The rhombohedral fluoroberyllium borate crystal set forth in claim 12, in which the crystal has a band gap of less than 200 nm.

14. The rhombohedral fluoroberyllium borate crystal set forth in claim 1, having an edge of greater than 3 millimeters.

15. The rhombohedral fluoroberyllium borate crystal set forth in claim 1, having an edge of greater than 5 millimeters.

16. A laser comprising the rhombohedral fluoroberyllium borate crystal set forth in claim 1.

17. An optoelectronic device comprising the rhombohedral fluoroberyllium borate crystal set forth in claim 1.

18. The optoelectronic device as set forth in claim 17, wherein the optoelectronic device is a non linear optical device.

19. The optoelectronic device as set forth in claim 17, wherein the optoelectronic device is a parametric oscillator.

20. The optoelectronic device as set forth in claim 17, wherein the optoelectronic device is a frequency multiplier.

21. The optoelectronic device as set forth in claim 17, wherein the optoelectronic device is a waveguide.

\* \* \* \* \*

UNITED STATES PATENT AND TRADEMARK OFFICE
CERTIFICATE OF CORRECTION

| | | |
|---|---|---|
| PATENT NO. | : 8,834,629 B2 | Page 1 of 1 |
| APPLICATION NO. | : 12/660540 | |
| DATED | : September 16, 2014 | |
| INVENTOR(S) | : Joseph W. Kolis et al. | |

It is certified that error appears in the above-identified patent and that said Letters Patent is hereby corrected as shown below:

In the Specification

Column 1, Line 11 (insert prior to FIELD OF INVENTION) -- This invention was made with government support under NSF grant number 0305377 awarded by the Division of Materials Research. The government has certain rights in the invention. --

Signed and Sealed this
Twenty-sixth Day of May, 2015

Michelle K. Lee
*Director of the United States Patent and Trademark Office*